United States Patent
Marka et al.

(10) Patent No.: US 10,194,545 B2
(45) Date of Patent: Jan. 29, 2019

(54) PROTECTING MEDICAL OPERATOR DEVICES

(71) Applicant: Trumpf Medizin Systeme GmbH + Co. KG, Saalfeld (DE)

(72) Inventors: Rudolf Marka, Ismaning (DE); Serhan Oezhan, Munich (DE)

(73) Assignee: Trumpf Medizin Systeme GMBH + Co. KG, Saalfeld (DE)

( * ) Notice: Subject to any disclaimer, the term of this patent is extended or adjusted under 35 U.S.C. 154(b) by 0 days.

(21) Appl. No.: 14/709,802

(22) Filed: May 12, 2015

(65) Prior Publication Data
US 2015/0245509 A1    Aug. 27, 2015

Related U.S. Application Data

(63) Continuation of application No. PCT/EP2013/003012, filed on Oct. 7, 2013.

(51) Int. Cl.
| | | |
|---|---|---|
| *H05K 5/02* | (2006.01) | |
| *H02J 50/10* | (2016.01) | |
| *G06F 1/16* | (2006.01) | |
| *A45C 11/00* | (2006.01) | |
| *H05K 5/06* | (2006.01) | |

(52) U.S. Cl.
CPC .......... *H05K 5/0217* (2013.01); *A45C 11/00* (2013.01); *G06F 1/1626* (2013.01); *H02J 50/10* (2016.02); *H05K 5/069* (2013.01); *A45C 2011/003* (2013.01); *G06F 2200/1633* (2013.01); *Y10T 29/49826* (2015.01)

(58) Field of Classification Search
CPC ......... A45C 2011/002; A45C 2011/003; H02J 7/025; H05K 5/03; H05K 5/0247
See application file for complete search history.

(56) References Cited

U.S. PATENT DOCUMENTS

| | | | |
|---|---|---|---|
| 5,812,188 A | | 9/1998 | Adair |
| 6,082,535 A | * | 7/2000 | Mitchell ................ A45C 11/00 |
| | | | 150/154 |
| 7,495,895 B2 | * | 2/2009 | Carnevali ............. G06F 1/1626 |
| | | | 361/679.26 |

(Continued)

FOREIGN PATENT DOCUMENTS

| | | |
|---|---|---|
| DE | 102008020968 A1 | 10/2008 |
| EP | 2180773 A1 | 4/2010 |
| WO | 9802170 A1 | 1/1998 |

OTHER PUBLICATIONS

Notification of Transmittal Translation of International Preliminary Report on Patentability and Written Opinion of the International Searching Authority corresponding PCT Application No. PCT/EP2013/003012, dated May 28, 2015, 11 pages.

(Continued)

*Primary Examiner* — Binh B Tran
*Assistant Examiner* — Douglas R Burtner
(74) *Attorney, Agent, or Firm* — Barnes & Thornburg LLP

(57) ABSTRACT

A shock protective frame, a foil envelope, and a protective envelope are provided as protection devices for an operator device having a touchscreen and configured to operate a medical apparatus. Appropriate protection of the operator device is provided according to combinations of the protection devices.

18 Claims, 4 Drawing Sheets

(56) References Cited

U.S. PATENT DOCUMENTS

| | | | | |
|---|---|---|---|---|
| 8,718,731 | B1* | 5/2014 | Tang | H04M 1/185 206/305 |
| 9,025,317 | B2* | 5/2015 | Richardson | H04M 1/0252 361/679.01 |
| 9,545,140 | B1* | 1/2017 | Johnson | A45C 11/00 |
| 9,614,569 | B2* | 4/2017 | Alsberg | H04B 1/3888 |
| 9,622,556 | B2* | 4/2017 | Fathollahi | A45C 11/00 |
| 2001/0002725 | A1 | 6/2001 | Pollet et al. | |
| 2002/0195910 | A1* | 12/2002 | Hus | G06F 1/1626 312/223.2 |
| 2005/0030707 | A1 | 2/2005 | Richardson et al. | |
| 2006/0000916 | A1* | 1/2006 | Amstutz | G06K 19/077 235/492 |
| 2006/0169607 | A1* | 8/2006 | Carnevali | G06F 1/1626 206/320 |
| 2006/0274493 | A1* | 12/2006 | Richardson | G06F 1/1626 361/679.4 |
| 2007/0247793 | A1 | 10/2007 | Carnevali | |
| 2008/0142129 | A1 | 6/2008 | Reasner et al. | |
| 2009/0080153 | A1* | 3/2009 | Richardson | H05K 5/0017 361/679.56 |
| 2009/0260844 | A1* | 10/2009 | Tseng | G03B 17/08 174/50.5 |
| 2010/0053854 | A1* | 3/2010 | Nishikawa | G06F 1/1626 361/679.01 |
| 2010/0096963 | A1 | 4/2010 | McLaughlin et al. | |
| 2010/0147737 | A1* | 6/2010 | Richardson | A45C 11/00 206/701 |
| 2011/0287726 | A1* | 11/2011 | Huang | H04B 1/3883 455/90.3 |
| 2012/0008880 | A1* | 1/2012 | Toth | A45C 11/00 383/42 |
| 2012/0118773 | A1* | 5/2012 | Rayner | G06F 1/1626 206/320 |
| 2012/0303520 | A1* | 11/2012 | Huang | H01M 10/46 705/39 |
| 2013/0258573 | A1* | 10/2013 | Muday | G06F 1/1613 361/679.21 |
| 2014/0226062 | A1* | 8/2014 | Parrill | H04N 5/2252 348/376 |
| 2014/0268519 | A1* | 9/2014 | Huang | H04B 1/3888 361/679.01 |
| 2015/0214991 | A1* | 7/2015 | Ranchod | H04M 1/04 455/575.8 |
| 2015/0327387 | A1* | 11/2015 | Arao | H01H 13/06 361/679.01 |
| 2017/0172268 | A1* | 6/2017 | Fathollahi | A45C 11/00 |
| 2018/0168304 | A1* | 6/2018 | Poon | A45C 11/00 |
| 2018/0242704 | A1* | 8/2018 | Richardson | A45C 11/00 |

OTHER PUBLICATIONS

European Search Report and Written Opinion for EP17165982.4 in German, dated Jun. 8, 2017.

* cited by examiner

PROTECTING MEDICAL OPERATOR DEVICES

CROSS-REFERENCE TO RELATED APPLICATIONS

This application is a continuation of and claims priority under 35 U.S.C. § 120 to PCT Application No. PCT/EP2013/003012 filed on Oct. 7, 2013, which claimed priority to German Application No. DE 10 2012 220 693.0, filed on Nov. 13, 2012. The contents of both of these priority applications are hereby incorporated by reference in their entirety.

TECHNICAL FIELD

The present disclosure relates to protecting medical operator devices, particularly those with touchscreens.

BACKGROUND

Protective envelopes for an operator device having a touchscreen can completely enclose the operator device in order to protect the operator device from splashing water. In some embodiments, a protection cover includes a thin diaphragm through which the touchscreen is operated. Furthermore, a protective envelope can be pulled over a monitor in order to enable an operation of the monitor in a sterile area. However, the operator device is not protected from damage caused by falling down. Furthermore, the protective cover needs to be sterilized in an elaborate manner and, when using the protective cover, which can be used as a one-way article, the protective cover can slip out of position so that the operation of the touchscreen in an undisturbed manner is not ensured. The protective envelope needs to have an orifice through which the operator device can be introduced and that needs to be closable in a manner that protects the operator device from splashing water.

SUMMARY

Implementations of the present disclosure provide protection for an operator device for use in a sterile environment which is simple, safe, inexpensive, and which does not impair an operation of the touchscreen.

Objectives of providing the protection device are achieved by a shock protective frame, a protective envelope, a protective casing, and protection systems including combinations of the shock protective frame, the protective envelope, the protective casing, and one or more other protective devices.

By using a shock protective frame that is sterilizable, the operator device is usable in a sterile area and it is also protected against damage when falling in the area.

By a protection system including a shock protective frame and a foil envelope of a sterilizable material enclosing the operator device, there is the option to use operator devices which are not sterile, themselves, in a sterile area.

By the formation of a protective envelope such that it encloses the operator device, wherein at least one face of the touchscreen remains accessible or uncovered by the protective envelope, it is possible to use commercially available operator devices having a touchscreen, such as a tablet computer, in an environment in which spray disinfection or wipe disinfection are necessary.

By a protection system having the sterilizable shock protective frame, the sterilizable foil envelope, and the protective envelope, an advanced protection against damage and an enhanced sterility compared to the aforementioned solutions is achieved.

The protective envelope can also be formed such that the protective envelope is sterilizable.

Other aspects, features, and advantages will be apparent from the description, the claims, and the drawings.

DETAILED DESCRIPTION

Figure 1:
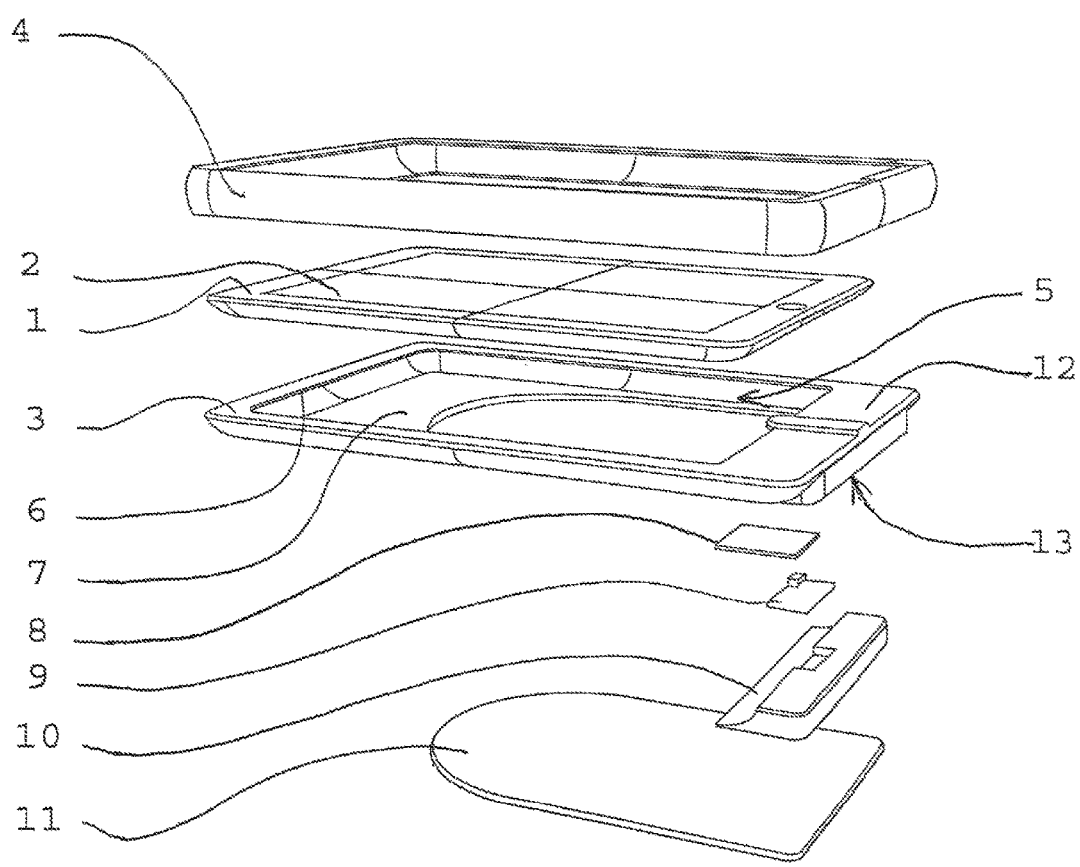
FIG. 1 shows an exploded view of a protection system having optional elements.

In FIG. 1, a protection system for protecting an operator device 1 having a touchscreen 2 is shown. In some embodiments, the operator device 1 may not include the touchscreen 2. Alternatively or additionally, the operating device 1 can include other operating elements, such as sealed switches or switches of a membrane keyboard. It is essential that there is no ingress of liquids (e.g., squirted liquids) between a housing of the operator device 1 and the operating elements.

The protection system includes a shock protective frame 4, optionally a protective envelope 3, and optionally a foil envelope that will be discussed in detail below.

The protective envelope 3 is formed as a shell-like structure and encloses the operator device 1 in a shell-like manner at least at the sides and at the rear side of the operator device 1. The protective envelope 3 has a top side 12 and a bottom side 13. Moreover, the protective envelope 3 has a recess 5 having an inner face 7 being adapted in particular to the rear side of the operator device 1 and forming an open volume for accommodating the operator device 1. The recess 5 has an orifice with a rim 6 at the top side 12.

The recess 5 is provided in the protective envelope 3 such that it leaves open at least the volume for accommodating the touch screen 2. At the rim 6 of the recess 5, the protective envelope 3 forms, together with the operator device 1, a liquid-tight transition (e.g., a liquid-tight seal).

Near the recess 5, the top side 12 includes an overhang that projects over the operator device 1 towards the recess 5. The overhang is formed such that it points towards the bottom side 13. Therefore, the rim 6 is arranged closer to the inner face 7 than a remaining area of the overhang. Accordingly, in an assembled configuration in which the operator device 1 is disposed within the protective envelope 3, the rim 6 abuts the outer surface of the operator device 1 with a pretension, thereby forming the liquid-tight transition.

In some embodiments, the protective envelope 3 optionally has a rib at the rim 6 protruding towards the inner face 7. Accordingly, it can also be ensured that the protective envelope 3 abuts the outer surface of the operator device 1 at the rim 6 with a pretension, thereby forming the liquid-tight transition.

In other embodiments, a combination of the aforementioned features or, for example, providing additional sealing lips or other sealing measures is possible.

By the protective envelope 3, all of the areas of the operator device 1 outside of a periphery of the touchscreen 2 are covered.

In alternative embodiments, additional recesses which are closed in a liquid-tight manner by a closure can be provided in the protective envelope 3.

The protective envelope 3 is made of silicone; however, in alternative embodiments, the protective envelope 3 can also be made of other suitable elastic materials. It is crucial that, when assembled with the operator device 1, the protective envelope 3 encloses the operator device 1, the recess 5 leaves open (e.g., accessible) at least the entire face of the touchscreen 2, and the rim 6 abuts the outer surface of the operator device 1 in a sealing manner with a sufficient pretension. The elastic protective envelope 3 enables a replacement of the protective envelope 3 by the user. Alternatively, the protective envelope 3 can also be formed in a dimensionally stable manner (i.e., the protective envelope 3 maintains its shape as long as no external forces act upon it). In this case, the protective envelope 3 cannot be removed or can only be removed by trained service personnel.

For enhancing the protection, there is the option to attach the shock protective frame 4 to the protective envelope 3 in order to protect the operator device 1 from damage, for example, when falling down on the floor. Accordingly, the shock protective frame 4 includes a contour at an inner circumference that is complementary to a contour of a circumferential edge of the protective envelope 3.

The shock protective frame 4 is made of silicone and is sterilizable. In alternative embodiments, the shock protective frame 4 is made of another suitable sterilizable material. The shock protective frame 4 is formed such that it forms an overhang at a front side and at a rear side of the protective envelope 3 so that the shock protective frame 4 encloses the operator device 1 in order to be securely mountable to the protective envelope 3.

Alternatively, the shock protective frame 4 is formed such that it encloses the operator device 1 and forms an overhang at a front side and at a rear side of the operator device 1.

When using a foil envelope (not shown here) in which the operator device 1, being in the protective envelope 3, is insertable, it is favorable to attach the shock protective frame 4 over the foil envelope so that a secure fixing of the foil envelope on the protective envelope 3 can be ensured by clamping the foil envelope between the shock protective frame 4 and the protective envelope 3.

The foil envelope is bag-shaped and has a size such that it entirely encloses the operator device 1 within the protective envelope 3. The foil envelope is sterilizable. In alternative embodiments, the foil envelope may be tube-shaped or formed as a portion of a bag or a tube.

The dimensions of the inner contour of the shock protective frame 4 and of the complementarily circumferential edge of the protective envelope 3 or of the operator device 1 and of the inner contour of the shock protective frame 4 are aligned such that the foil envelope can be clamped between the shock protective frame 4 and the protective envelope 3 or between the shock protective frame 4 and the operator device 1. Therefore, the foil envelope can fit closely over the touchscreen 2 so that the operation of the touchscreen 2 is undisturbed.

In an optional embodiment, the protective envelope 3 is provided with an induction coil 8. The induction coil 8 is connected to the operator device 1 via an electronic controller 10 on a printed circuit board 11 and enables a contactless charging of an accumulator battery of the operator device 1. The induction coil 8 is brought into the vicinity of an additional coil (not shown), and the electric energy is transmitted to the operator device 1 in a contactless manner via an inductivity without the need of a recess in the protective envelope 3.

In a further alternative embodiment, the protective envelope 3 is additionally or alternatively provided with a radio transmitter and receiver. Via the radio transmitter and receiver, localizing the operator device 1 is possible. Accordingly, there is the option to determine the spatial position of the operator device 1 with respect to the apparatuses to be operated and/or to accordingly adjust the display of the touchscreen.

Figure 2:
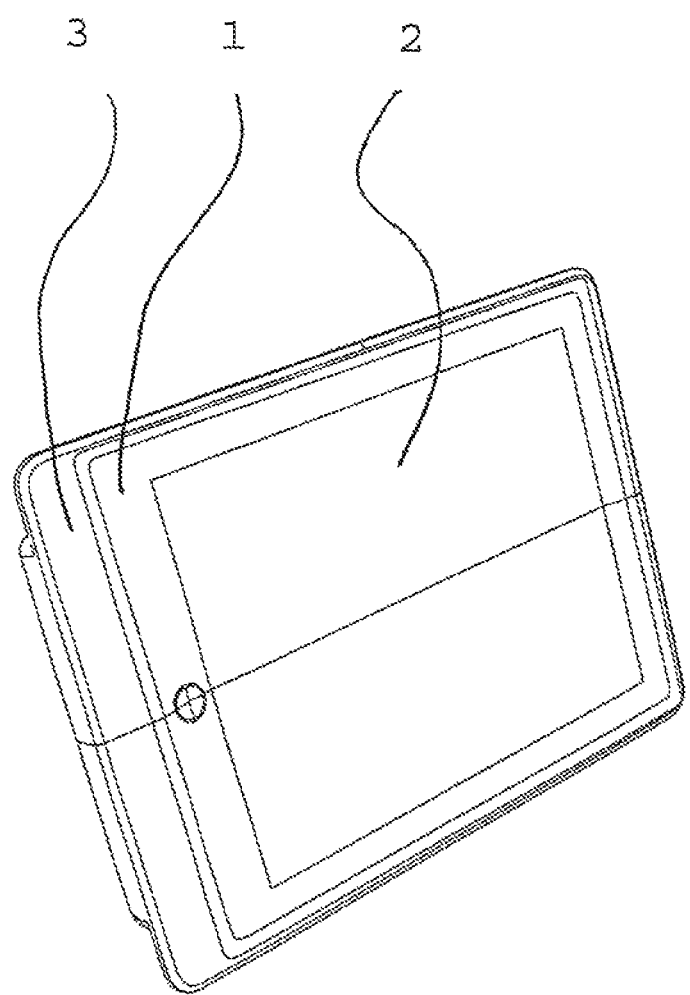
FIG. 2 shows an operator device having a touchscreen with a protective envelope.

FIG. 2 shows the operator device 1 having the touchscreen 2 with the protective envelope 3.

Figure 3:
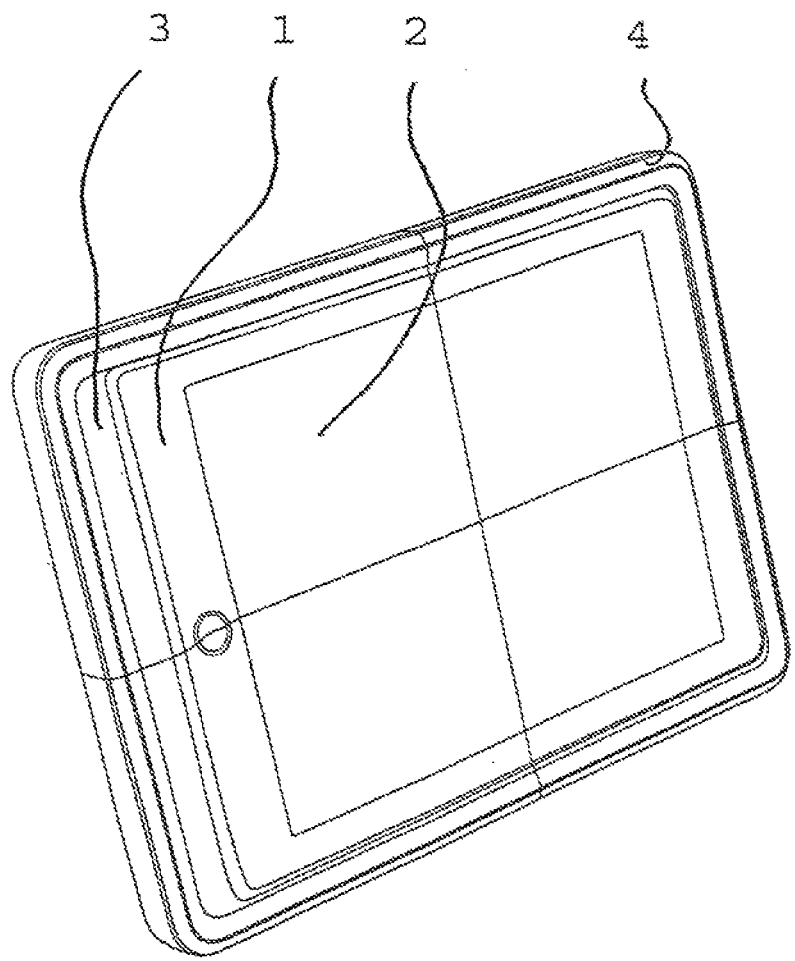
FIG. 3 shows the operator device of FIG. 2 with a shock protective frame.

FIG. 3 is an illustration of the operator device 1 with the protective envelope 3 of FIG. 2 being additionally provided with the shock protective frame 4.

Figure 4:
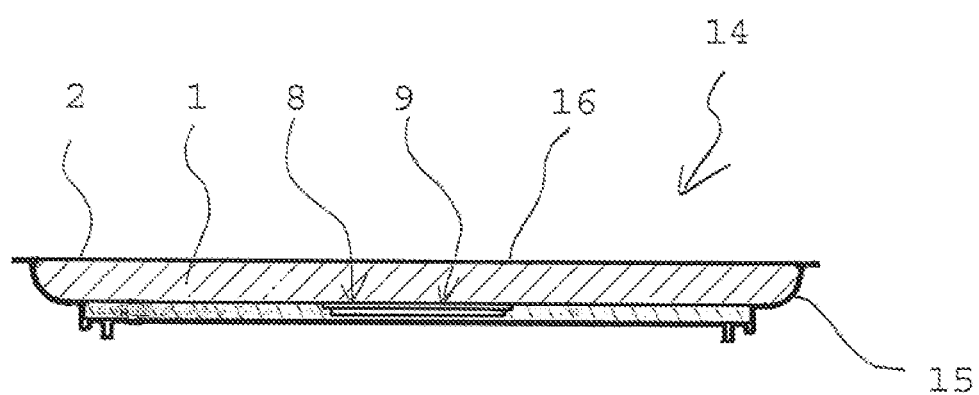
FIG. 4 shows a cross-sectional view of a protective casing.

In FIG. 4, a cross-sectional illustration of a protective casing 14 is shown. The protective casing 14 includes a lower casing part 15 and an upper casing part 16.

The lower casing part 15 is a formed part of a plate-shaped plastic base material. Alternatively, the lower casing part 15 may be formed by injection molding or the like. In a further alternative, a suitably flexible material, such as a foil enabling a suitable form adjustment to the operator device 1 when being connected to the upper casing part 16, can be used. Such a foil has an inner side and is formed into a shape so that the inner side of the foil is adapted to areas of the sides and of the rear side of the operator device 1. Such a configuration limits relative movement between the operator device 1 and the protective casing 14. The lower casing part 15 is not exactly adapted (e.g., formed complimentary) to the operator device 1 since such a configuration would prevent an introduction of additional elements or assemblies and possibly prevent the use of similar operator devices. Alternatively, an exact adjustment to the shape can be provided. By the forming, the stiffness of the lower casing part 15 with respect to the base material is increased so that it is dimensionally stable (i.e., the lower casing part 15 maintains its shape as long as no external forces act upon it). Optionally, the lower casing part 15 is made of a material having a stiffness and a wall thickness such that the lower casing part 15 is inelastic (i.e., being deformable only with application of a substantial force). Such an inelastic configuration provides an additional protection against damage of the operator device 1. The lower casing part 15 further includes a circumferential area to which the upper casing part 16 can be fixed continuously.

The upper casing part 16 is formed as an elastic, transparent foil (e.g. a polyethylene foil) that allows a directed transmission of an operation of the upper casing part 16 to the touchscreen 2. Therefore, operations such as typing or a swiping on the upper casing part 16 are recognized by the touchscreen 2 so that the touchscreen 2 of the operator device 1 can be faultlessly operated. The upper casing part 16 has a size and a material which enable an indivisible connection with the lower casing part 15. Contrary to the lower casing part 15, for simplifying the production process, the upper casing part 16 is not provided as a formed part but is applied as a flat material to the lower casing part 15 for further processing. Due to manufacturing and production considerations, it is useful to provide the lower casing part 15 and the upper casing part 16 of the same material, and in particular, also having the same wall thickness. Due to the geometry according to the forming, the lower casing part 15 has a higher stiffness as compared to the upper casing part 16.

As an indivisible connection, a connection is understood which only can be separated by a destruction of the connection. The connection is formed, for example, by welding or bonding. A renewed creation of a destroyed connection is possible if the lower casing part 15 and the upper casing part 16 remain substantially intact upon destruction of the connection.

By the forming of the lower casing part 15 and the upper casing part 16 and by their connection, the protective casing is liquid-tight. The materials of the lower casing part 15 and of the upper casing part 16 provide a seal that is resistant to disinfectants, such that the operator device 1 is also protected, for example, during a wipe disinfection.

Compared to the mere use of a protective foil, the durability of the protective casing 14 is considerably higher.

The electronic components for localizing the operator device 1, such as the radio transmitter/receiver, and/or for contactless charging of the accumulator battery of the operator device 1, such as the induction coil, are provided in the protective casing 14.

When connecting the lower casing part 15 and the upper casing part 16, a vacuum is optionally generated in the protective casing 14. The vacuum is set at a level that is lower than an air pressure possible at a global (e.g., ambient) or defined operating environment. Therefore, the protective casing 14 is prevented from bulging under any global operating condition, (e.g., in hospitals located at high altitudes).

The protective casing 14 is manufactured as described below.

Starting from the plate-shaped base material, the lower casing part 15 is brought into the shape adapted to the operator device 1 by vacuum forming so that the inner side of the lower casing part 15 is adapted to the areas of the sides and of the rear side of the operator device 1. In this manner, the circumferential area for a continuous fixation to the upper casing part 16 is created. Alternatively, other manufacturing techniques (e.g., injection molding of plastic granules) are possible.

Subsequently, the operator device 1 is inserted into the lower casing part 15.

Optionally, the electronic components for localizing and/or for charging the operator device 1 in a contactless manner are inserted into the protective casing.

Finally, the upper casing part 16 and the lower casing part 15 are brought together along circumferential areas such that the parts 15, 16 are indivisibly joined in a liquid-tight manner. The indivisible joining happens by bonding, welding, or another suitable technique (e.g., caulking)

Figure 5:
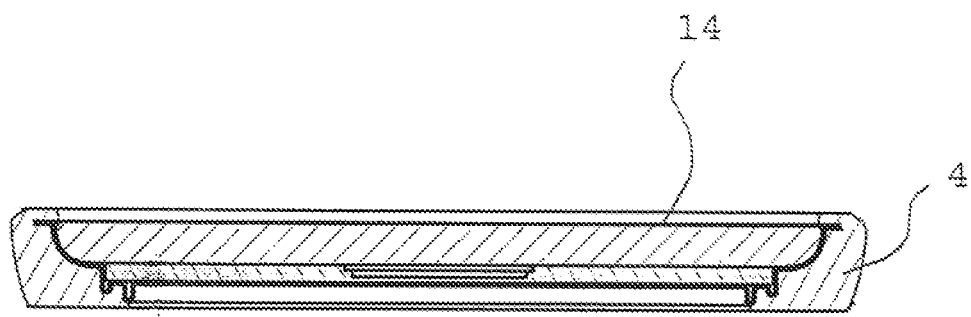
FIG. 5 shows a cross-sectional view of the protection system of the protective envelope and the shock protective frame.

FIG. 5 shows a cross-sectional illustration of the protection system of the protective casing 14 and the shock protective frame 4. The removable shock protective frame 4 provides an additional protection against shocks (e.g., when the operator device 1 falls) and enhances the grip and a capability of positioning of the operator device 1 on a charging station.

A number of embodiments have been described. Nevertheless, it will be understood that various modifications may be made without departing from the spirit and scope of the disclosure. Accordingly, other embodiments are within the scope of the following claims.

What is claimed is:

1. A medical operator device protection system for an operator device having a touchscreen and configured to operate a medical apparatus, the medical operator device protection system comprising:
   a shock protective frame made of an elastic material that is sterilizable, the shock protective frame being sized and configured to enclose the operator device while forming an overhang at a front side and at a rear side of the operator device,
   a liquid-tight protective casing, the protective casing being sized to enclose the operator device and being insertable between the operator device and the shock protective frame, a protective envelope for the operator device, the protective envelope defining a recess having an inner face,
   wherein the protective casing is sized to enclose the operator device assembled with the protective envelope and is positionable within the protective envelope and the shock protective frame,
   wherein at a rim of the recess, a top side of the protective envelope forms an overhang that projects over the operator device towards the recess and points towards a bottom side of the protective envelope.

2. The protection system according to claim 1, wherein the rim comprises a rib protruding towards the inner face.

3. The medical operator device protection system according to claim 1, wherein the protective envelope is formed such that all areas of an outer surface of the operator device except at least a portion of the touchscreen are covered.

4. The medical operator device protection system according to claim 1, wherein the protective envelope comprises at least one additional recess that can be closed by a closure in a liquid-tight manner.

5. The medical operator device protection system according to claim 1, wherein the protective envelope is made of silicone.

6. The medical operator device protection system according to claim 1, wherein the protective envelope comprises electronic components for one or more of localizing the operator device and contactless charging of an accumulator battery of the operator device.

7. The medical operator device protection system according to claim 6, wherein the protective envelope comprises an induction coil for charging the accumulator battery in a contactless manner.

8. The medical operator device protection system according to claim 6, wherein the protective envelope comprises a radio transmitter/receiver for localizing the operator device.

9. The medical operator device protection system according to claim 1, the protective casing comprising a lower casing part and an upper casing part, wherein the lower casing part is formed such that an inner side thereof is adapted or adaptable to areas of sides and of a rear side of the operator device and comprises a circumferential face for continuously fixing the upper casing part, wherein the upper casing part is transparent and elastic, such that an operation of the upper casing part can be transmitted directly to the touchscreen, and wherein the upper casing part comprises an area at which the upper casing part is fixable to the circumferential face of the lower casing part.

10. A protective casing for an operator device having a touchscreen and configured to operate a medical apparatus, comprising a lower casing part and an upper casing part,
   wherein the lower casing part is formed such that an inner side thereof is adapted or adaptable to areas of sides and of a rear side of the operator device and comprises a circumferential face for continuously fixing the upper casing part, wherein the upper casing part is transparent and elastic, such that an operation of the upper casing part can be transmitted directly to the touchscreen, wherein the upper casing part comprises an area at which the upper casing part is fixable to the circumferential face of the lower casing part to form a liquid-tight protective casing, and wherein the protective casing is sized to enclose the operator device assembled with the protective casing and is insertable within a protective envelope and a shock protective frame.

11. The protective casing according to claim 10, wherein the upper casing part and the lower casing part are joined to each other in an indivisible manner.

12. The protective casing according to claim 10, wherein the lower casing part is formed in a dimensionally stable manner.

13. The protective casing according to claim 10, wherein the protective casing has an inner pressure that is lower than an ambient air pressure during use.

14. The protective casing according to claim 10, wherein the lower casing part and the upper casing part are each made of a material having a resistance to a disinfectant.

15. The protective casing according to claim 10, further comprising electronic components for one or more of localizing the operator device and charging an accumulator battery of the operator device in a contactless manner.

16. The protective casing according to claim 10, further comprising an induction coil for charging the accumulator battery in a contactless manner.

17. The protective casing according to claim 10, further comprising a radio transmitter/receiver for localizing the operator device.

18. A method for manufacturing a protective casing for an operator device having a touchscreen and configured to operate a medical apparatus, the method comprising:

forming a lower casing part of a first material such that an inner side thereof is adaptable to areas of sides and of a rear side of the operator device and such that a circumferential face is provided for continuously fixing an upper casing part;

forming the upper casing part of a second material such that the upper casing part is transparent and elastic, such that an operation of the upper casing part can be transmitted directly to the touchscreen, and such that an area is provided at which the upper casing part is fixable to the circumferential face of the lower casing part;

inserting the operator device into the lower casing part or placing the operator device on the upper casing part; and bringing together the lower casing part and the upper casing part; and joining the lower casing part and the upper casing part to form a liquid-tight protective casing; and enclosing the operator device and the protective casing within a protective envelope and a shock protective frame.

* * * * *